(12) United States Patent
Fan et al.

(10) Patent No.: US 6,590,159 B2
(45) Date of Patent: Jul. 8, 2003

(54) COMPACT STACKED ELECTRONIC PACKAGE

(75) Inventors: Zhineng Fan, Santa Clara, CA (US); Ai D. Le, Sunnyvale, CA (US); Che-Yu Li, Ithaca, NY (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

(21) Appl. No.: 09/775,991

(22) Filed: Feb. 5, 2001

(65) Prior Publication Data

US 2002/0112871 A1 Aug. 22, 2002

(51) Int. Cl.⁷ .............................................. H01L 23/02
(52) U.S. Cl. .......................... 174/52.4; 439/66; 439/74
(58) Field of Search .............................. 174/52.2, 52.4; 439/65, 66, 74; 361/784, 785, 803

(56) References Cited

U.S. PATENT DOCUMENTS 5,134,546 A * 7/1992 Izumi et al. ................ 361/395
6,354,844 B1 * 3/2002 Coico et al. .................. 439/66

* cited by examiner

Primary Examiner—Hung V. Ngo
(74) Attorney, Agent, or Firm—Salzman & Levy

(57) ABSTRACT

The present invention provides an electronic package for high speed, high performance semiconductors. It includes a plurality of devices, circuit members and short interconnections between the circuit members for maintaining high electrical performance. Suitable applications requiring high speed, impedance-controlled transmission line buses throughout the entire package include microprocessor and digital signal processor data buses, and high speed memory buses for products such as laptop and handheld computing and telecommunications devices. Circuit members include printed circuit boards and circuit modules, and may be formed from a wide variety of materials with unpacked or packed semiconductors attached directly to the circuit members. Through the use of clamps the package is at least factory reworkable and can be field separable. Thermal management structures may be included to maintain the high density devices within a reliable range of operating temperatures.

42 Claims, 6 Drawing Sheets

COMPACT STACKED ELECTRONIC PACKAGE

RELATED PATENT APPLICATIONS

This application is related to U.S. Pat. No. 6,172,895, issued to Brown et al. for HIGH CAPACITY MEMORY MODULE WITH BUILT-IN HIGH SPEED BUS TERMINATIONS and U.S. patent applications, Ser. No. 09/457,776, filed Dec. 9, 1999, U.S. patent applications Ser. Nos. 09/645,860, 60/227,689, 60/227,859, 09/645,859, and 09/645,858, all filed Aug. 24, 2000; U.S. patent application Ser. No. 09/774,857, filed Jan. 31, 2001; and U.S. patent application Ser. No. 09/791,342, filed Feb. 26, 2001, all of which are hereby incorporated by reference.

FIELD OF THE INVENTION

The present invention relates to high density, low profile electronic packages and, more particularly, to the packaging of high performance, high density semiconductors having impedance-controlled transmission line buses for maintaining high electrical performance.

BACKGROUND OF THE INVENTION

The current trend in electronic package design for use in high speed electronic systems is to provide high electrical performance, high density and highly reliable interconnections between various circuit devices, which form important parts of those systems. The system may be a computer, a telecommunications network device, a handheld "personal digital assistant", medical equipment, or any other electronic equipment.

High reliability for such connections is essential due to potential end product failure, should vital misconnections of these devices occur. It is also very important that the interconnections be as dense as possible, use the least possible amount of real estate on the printed circuit board, and provide minimal impact on the printed circuit board wiring. In some cases, such as for laptop computers and handheld devices, it is very important that the height of the connectors and the auxiliary circuit members be as low as possible.

As system density and performance have increased so dramatically, so have the stringent specifications for interconnections. One way high electrical performance is manifested is in improved signal integrity. This can be accomplished by providing the interconnections with shielding that helps them to more closely match a desired system impedance. These demanding requirements, especially when coupled with the requirement for field-separability, have led to a wide variety of possible connector solutions.

Also, to assure effective repair, upgrade, and/or replacement of various components of the system (e.g., connectors, cards, chips, boards, modules, etc.), it is desirable that the connections be reworkable at the factory. It is also highly desirable in some cases that, within the final product, such connections be separable and reconnectable in the field. Such a capability is also desirable during the manufacturing process for such products in order to facilitate testing, for example.

A land grid array (LGA) is an example of such a connection in which each of two primarily parallel circuit elements to be connected has a plurality of contact points, arranged in a linear or two-dimensional array. An array of interconnection elements, known as an interposer, is placed between the two arrays to be connected, and provides the electrical connection between the contact points or pads. For even higher density interconnections, additional parallel circuit elements may be stacked and electrically connected through additional LGA connectors to create three-dimensional packages. In any case, since a retentive force is not inherent as in a pin-and-socket type interconnection, a clamping mechanism is needed to create the force necessary to ensure each contact member is compressed an appropriate amount during engagement to form the required interconnections to the circuit elements. While LGA interposers are implemented in many different ways, the implementations of most interest are those described in the aforementioned copending U.S. patent applications.

There have been many limitations to the successful implementation of high density, low profile, low cost, three dimensional electronic packages. Firstly, higher density packages were needed only for very high-end electronic applications such as supercomputers, where size, weight and cost were not issues. Secondly, high volume products such as personal computers were cost sensitive and had sufficient internal room which encouraged engineers to use existing electronic packages. Thirdly, portable and handheld devices were simple enough and too cost sensitive to demand higher density packaging technologies. Overall, the electronic package technology currently available has been unable to meet the stringent set of requirements listed above. It is believed that a high density, low profile, low cost, three dimensional electronic package would constitute a significant advancement in the art.

It is, therefore, an object of the invention to enhance the electrical interconnection art.

It is another object of the invention to provide a high density electronic package with improved electrical and mechanical performance and reliability.

It is an additional object of the invention to provide a high density electronic package that is low profile.

It is an additional object of the invention to provide a high density electronic package with improved manufacturability, lower cost and one that is factory reworkable.

It is an additional object of the invention to provide a high density electronic package that is light weight and provides a small, low profile form factor.

It is a still further object of the invention to provide a high density electronic package that is field separable.

SUMMARY OF THE INVENTION

The present invention provides a high density, low profile electronic package for high speed, high performance semiconductors. It includes a plurality of devices, circuit members and short interconnections between the circuit members for maintaining high electrical performance. Certain applications requiring high speed, impedance-controlled transmission line buses throughout the entire package. These include but are not limited to microprocessor and digital signal processor data buses, and high speed memory buses for products such as laptop and handheld computing and telecommunications devices. Circuit members include printed circuit boards and circuit modules, and may be formed from a wide variety of materials with unpacked or packed semiconductors attached directly to the circuit members. Through clamping means the package is at least factory reworkable and can be field separable. Thermal management structures may be included to maintain the high density devices within a reliable range of operating temperatures.

BRIEF DESCRIPTION OF THE DRAWINGS

A complete understanding of the present invention may be obtained by reference to the accompanying drawings, when taken in conjunction with the detailed description thereof and in which:

FIG. 3b is an exploded perspective view of the electronic package shown in FIG. 3a.

DETAILED DESCRIPTION OF THE PREFERRED EMBODIMENT

Generally speaking, the present invention provides an electronic package for high speed, high performance semiconductors. The package includes a plurality of devices, circuit members and short interconnections between the circuit members for maintaining high electrical performance. Examples of circuit members include high density circuit cards or modules with either bare semiconductors or conventionally packaged ones mounted thereon. The package includes clamping means and, optionally, may have thermal management structures and alignment means. Short LGA connectors provide the electrical interconnection between circuit members and a motherboard.

Figure 1A:
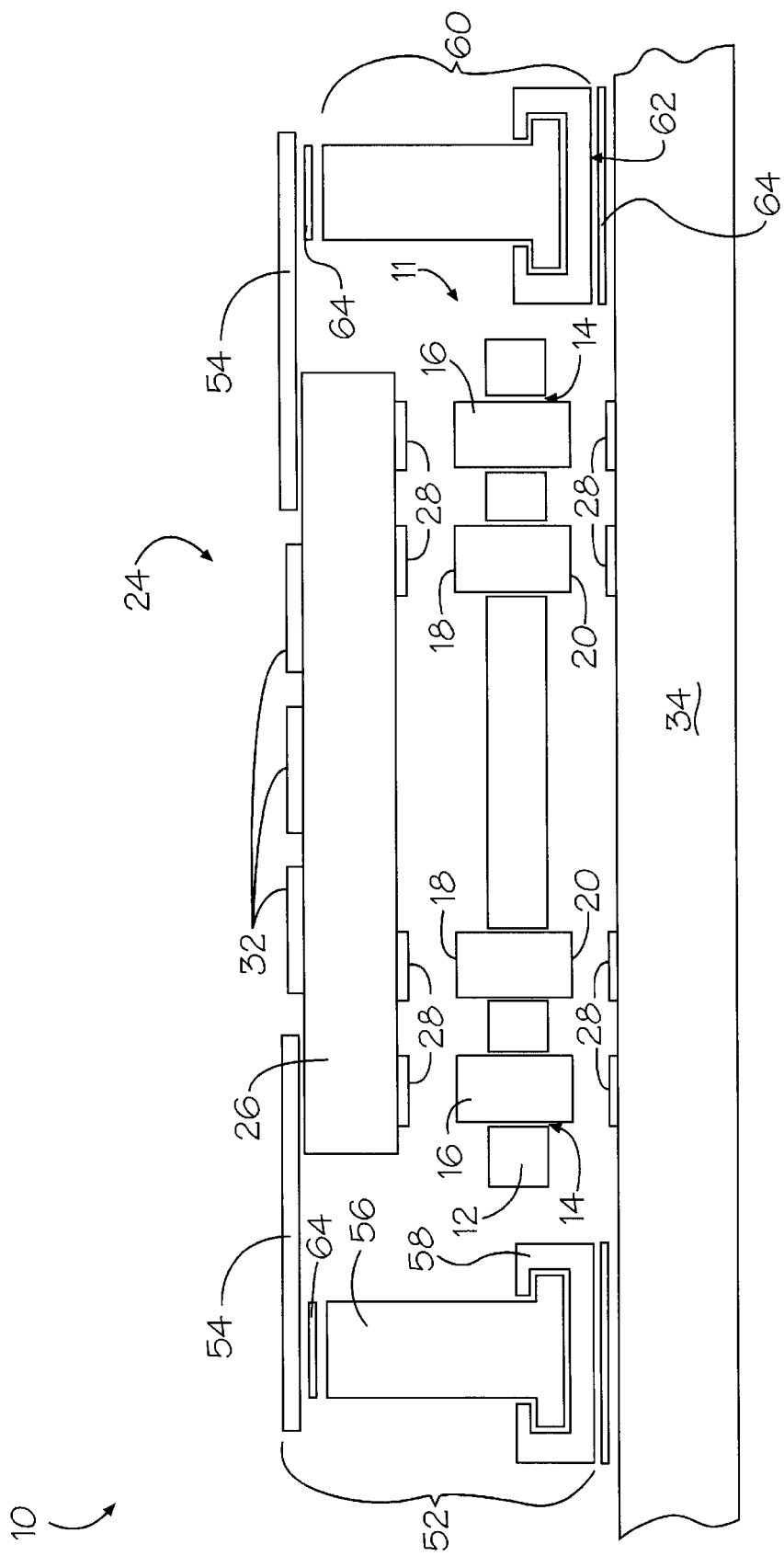
FIG. 1a is a side view, in section and on an enlarged scale, of a low profile electronic package in accordance with one embodiment of the present invention.

Referring first to FIG. 1a, there is shown an electronic package 10 of the present invention for electrically interconnecting electrical circuit members 24 and 34 by means of a connector 11 disposed between them. Examples of circuit members suitable for interconnection by connector 11 include printed circuit boards, circuit modules, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components (e.g., semiconductor chips, conductive circuitry, conductive pins, etc.), which may form part thereof. Such modules are also well known in the art and further description is not believed necessary.

In these embodiments the clamping mechanism is not field separable but is readily reworkable at the factory. This is appropriate for applications where the ability to upgrade in the field is not a requirement and lowest possible manufacturing cost is desired.

Connector 11 includes a common, electrically insulative carrier member 12 having a plurality of internal apertures or openings 14. The openings 14 are typically cylindrical in shape. Resilient contact members 16 are located so as to substantially occupy a respective opening 14 in carrier member 12. Contact members 16 are preferably of a construction and composition as taught in copending U.S. patent application, Ser. No. 09/457,776.

In one example each contact member 16 has a diameter of about 0.026 inch and a corresponding length of about 0.040 inch. Openings 14 have a diameter of 0.028 inch, just 0.002 inch larger than that of contact members 16. The center-to-center distance is 0.050 inch, but could be reduced to about 0.035 inch or less, if required. For any given application, an individual contact member may be used to provide a signal, power, or ground interconnection. In one example each contact member 16 has a maximum resistance of 0.020 ohm. This allows contact members 16 to pass high currents with only a small voltage drop.

Each opposing end 18 and 20 of each contact member 16 is designed for electrically contacting respective circuit members 24 and 34. As stated, circuit members 34 may be printed circuit boards having flat conductive pads (e.g., copper terminals) 28 located on an upper surface thereof. These circuit members may also comprise a circuit module 24 including a substrate 26 having a plurality of semiconductor elements 32 thereon. Circuit modules 24 may be packaged or unpackaged devices with a myriad attachment options including but not limited to surface mount, ball grid array, and wire bond. It should be understood that other electronic components, such as but not limited to resistors and capacitors, would typically be included with and interconnected to elements 32. They are not shown here only for purposes of clarity.

Corresponding thin, flat, copper conductive pads 28 can be located on a bottom, external surface of circuit module 24. Understandably, the conductive pads 28 are electrically coupled to corresponding circuitry, which forms part of the respective electrical circuit members. These pads 28 may provide signal, power or ground connections, depending on the operational requirements of the respective circuit member.

Carrier member 12, which may also include alignment openings 37 (FIG. 1b), is designed for positioning between opposing circuit members 24 and 34, and is aligned therewith. While carrier member 12 is shown in one of its simpler embodiments, for improved clarity of other elements and features of the invention, the teachings of two of the referenced copending U.S. patent applications are considered important aspects of the instant invention that significantly improve performance of carrier member 12. Copending U.S. patent application Ser. No. 09/645,860 teaches the mechanical and reliability improvement of carrier member 12 through the inclusion of features such as retentive members in openings 14, and layers of spacers located above and below the planer surfaces of carrier member 12. Copending U.S. patent applications Ser. No. 60/227,859 and Ser. No. 09/791,342 teach that carrier member 12 can be improved electrically such as by metallizing openings 14, including conductive layers, including additional components, and further including pairs of shorter length contact members, thereby creating a shielded carrier member 12 with additional functionality that can also save real estate on circuit members 24 and 34. The recommendations of materials and processes of the aforementioned patent applications are also important to the improved manufacturability and lower cost of the instant invention.

Each resilient contact member 16 is compressed during engagement by clamping means 52 to form the appropriate interconnection between corresponding pairs of conductive pads 28. Clamping means 52 consists of an upper plate 54, spacers 56, and relief chambers 58. Upper plate 54 is intended to contact and apply force to the top surface of circuit member 24. Depending on requirements, upper plate 54 may contact only a small portion of the perimeter of circuit member 24 or it may contact a much larger portion thereof. In this embodiment, upper plate 54 is preferably made of a metal such as steel or a copper alloy and is 0.100 inch thick. Steel is preferred for its strength.

Spacers 56 are preferably metal, but may also be made of other materials such as plastic. Relief chambers 58 are also preferably metal such as steel.

The height of spacer/relief chamber pairs 60 relative to the height of contact members 16 is used to control the displacement of, or force on the contact members 16 of connector 11. Spacers 56 must be elastically robust in order to maintain the required contact force on all of the contact members 16 over the life of the clamping mechanism 52 following assembly. Relief chamber 58 has a cross sectional shape that is complementary to that of spacer 56 but is slightly larger. It also provides a relatively flat surface 62 that is used to attach it to circuit member 34.

Spacers 56 and relief chambers 58 work together as integral units to provide the clamping forces on upper plate 54. In this embodiment, the spacer/chamber pairs 60 are longer strips located just left and right, and extend to the back edge of circuit member 24 and carrier member 12. Variations to this may be desirable and are well within the teachings of this invention. Spacer/chamber pairs 60 are designed to allow movement in two dimensions in the plane of circuit member 34 to relieve thermal expansion displacement mismatches. The attachment means 64 can be made as thin as possible in order to be elastically strong but avoid high thermal stresses, which are damaging to thin layers of material.

In this embodiment spacers 56 are attached to upper plate 54 and relief chambers 58 are attached to circuit member 34 by attachment means 64, which is intended to be reworkable at the factory. Many methods many be used to accomplish this reworking procedure including chemical (e.g., dissolvable adhesives) and metallurgical (e.g., thin solder layers).

To take full advantage of the benefits this clamping mechanism 52 provides, such as avoiding CTE mismatches and having a light weight and a small form, it is preferable that connector 11 have high compliance to accommodate the non-planarity of mating circuit members 24 and 34, especially at lower clamping forces.

It should be obvious to those skilled in the art that the parameters such as the specific shape, dimensions, and materials of upper plate 54 and spacer/chamber pairs 60 may vary depending on certain requirements. These types of variations are well within the scope of the present invention.

Although a means for aligning circuit member 24 and carrier member 12 to circuit module 34 has not been shown specifically in this embodiment, it should be readily apparent to those skilled in the art of the multitude of methods that may be implemented. Examples are disclosed in copending U.S. patent applications, Ser. Nos. 09/645,860 and 60/227,859. An additional method is disclosed in FIG. 1b. There is shown an electronic package 30 further including alignment means to align carrier member 12 to circuit member 34. In this embodiment the alignment means consists of a plurality of pins 33, solder, chemical, or other attachment mechanism known in the art 64 and alignment openings 37. It should be obvious to those skilled in the art how this approach can be applied to other embodiments, including those described hereinbelow.

During the assembly process, each resilient contact member 16 is compressed by assembly fixturing (not shown) and retained by clamping means 52 to form the appropriate interconnection between corresponding pairs of conductive pads 28.

Figure 1B:
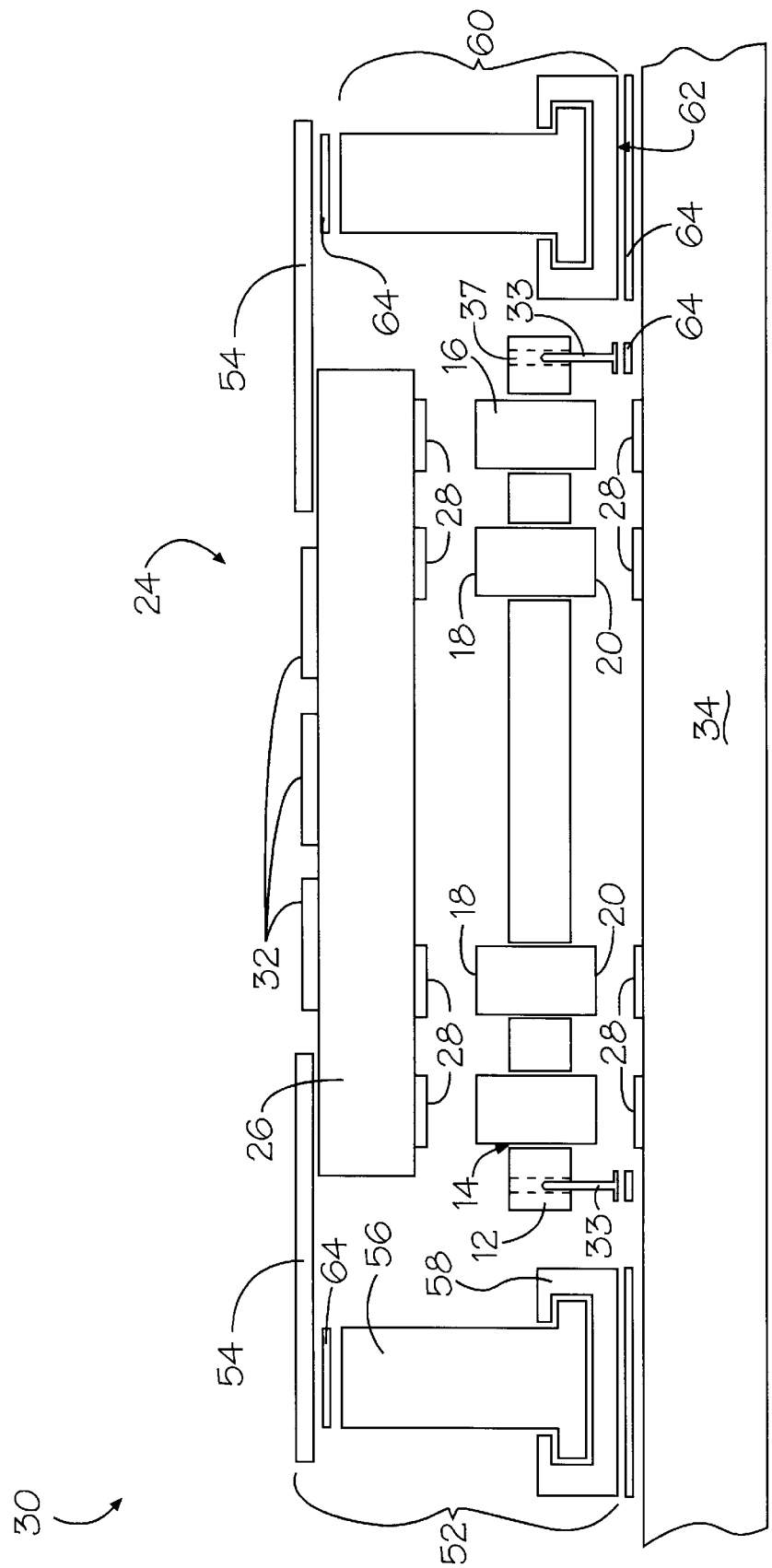
FIG. 1b is a cross section, enlarged side view of the electronic package shown in FIG. 1a further including alignment means.
Figure 1C:
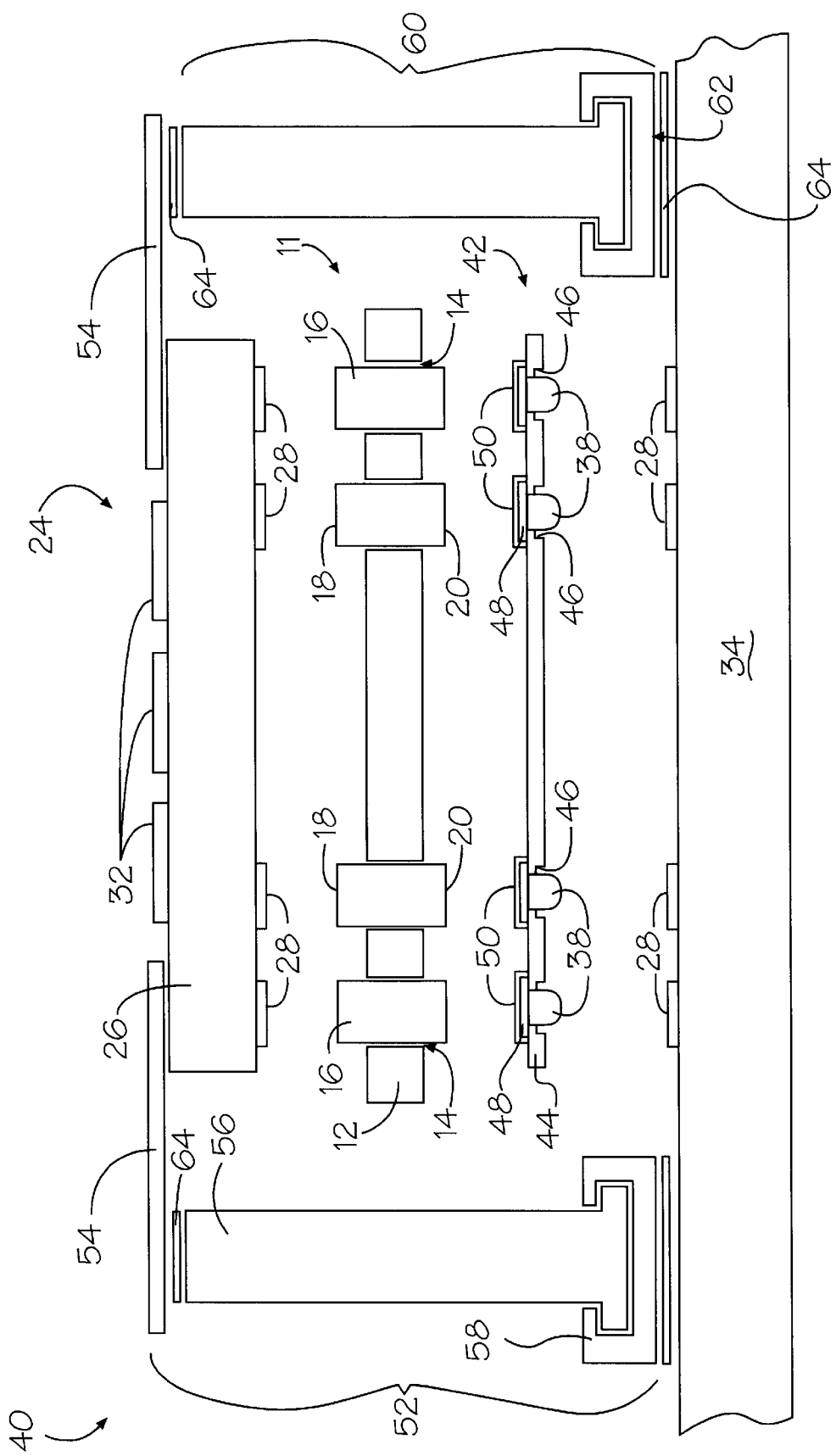
FIG. 1c is a cross section, enlarged side view of the electronic package shown in FIG. 1a further including an interposer.

Referring now to FIG. 1c, there is shown a side view of an electronic package 40 similar to electronic package 10 of FIG. 1a, but further including an interposer 42 for providing a reworkable plurality of conductive pads 48 for electrical circuit member 34. When used in conjunction with connector 11, a path for electrically interconnecting electrical circuit members 24 and 34 is provided.

Interposer 42, as taught in copending U.S. patent application Ser. 60/227,689, acts as a carrier for higher-risk and/or expensive processes, such as special platings on contact pads, that may limit or affect the yields and/or costs of printed circuit structures, such as boards, cards, modules, etc. Contact pads are provided that are large enough for adequate connector alignment tolerances and the proper functioning of high density connectors. The inclusion of interposer 42 improves the manufacturability and reliability of the present invention. It should be obvious to those skilled in the art how this approach can be applied to other embodiments, including those described hereinbelow.

Interposer 42 includes a dielectric layer 44 having a plurality of internal stepped apertures or openings 46, each one corresponding to and aligned with a conductive pad 48. In one example, dielectric layer 44 is composed of Kapton (a trademark of E. I. DuPont deNemours & Co., Wilmington, Del.) or Upilex (a trademark of Ube Industries, Ltd., Japan) and is 0.010-inch thick. Other examples of suitable material for dielectric layer 44 are liquid crystal polymer (LCP) and epoxy-glass-based materials (i.e., FR4). This material has a coefficient of thermal expansion (CTE) that substantially matches the CTE of the surrounding structures. Dielectric layer 44 may also comprise more than one layer of material to allow the implementation of alternate methods of manufacture.

Conductive members 38 are intended to be located in corresponding stepped openings 46 and are in electrical contact with corresponding conductive pads 48. In one example, the diameter of conductive member 38 is 0.026 inch and the height is 0.013 inch prior to reflow. Conductive pads 48 are copper, covered by a plating layer 50, which in this example is a 200 micro-inch thick layer of nickel covered by a 50 micro-inch thick layer of gold. In this example, the center-to-center distance of conductive pads 48 is 0.050 inch, but could be reduced to about 0.035 inch or less, if required.

Figure 2:
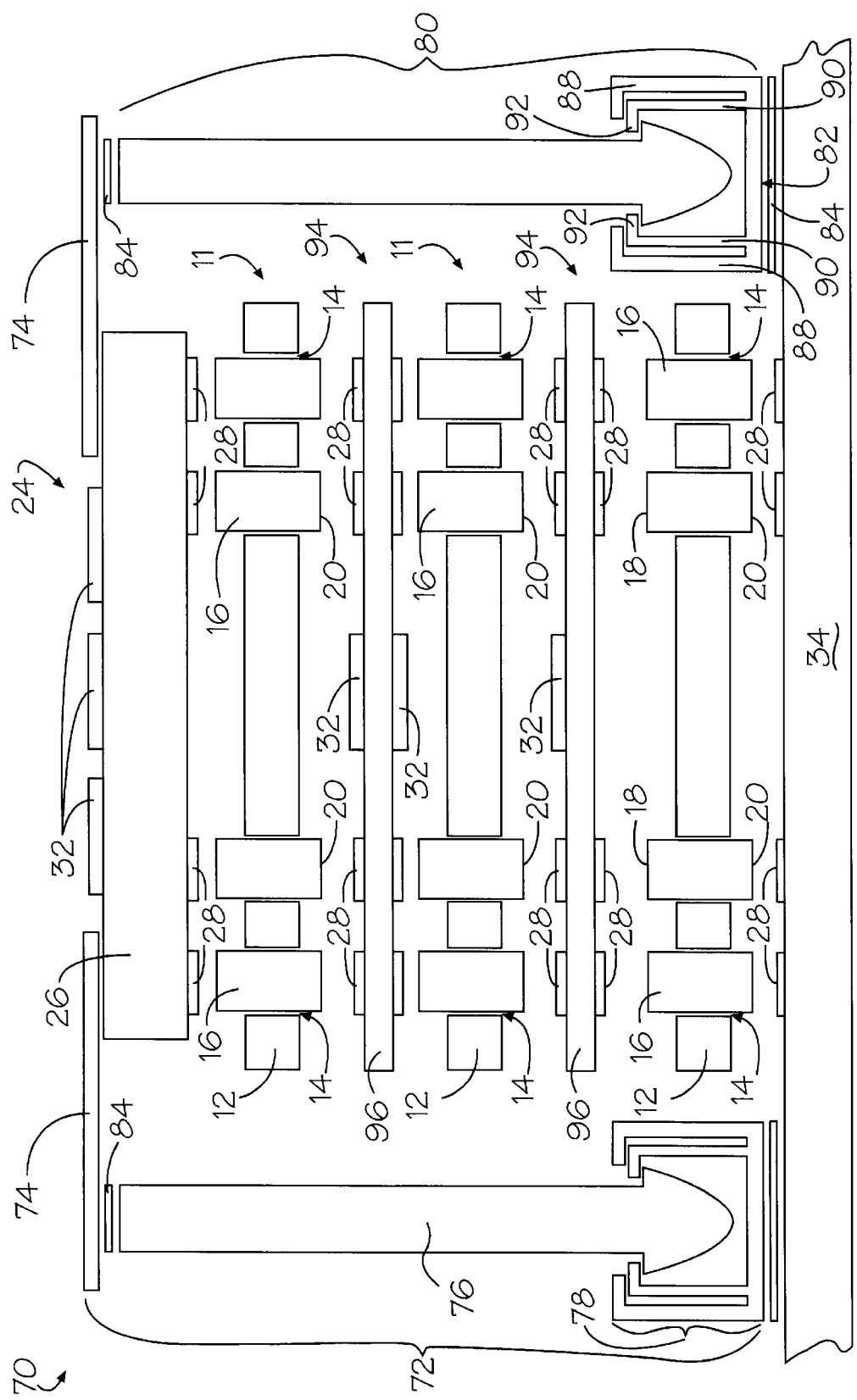
FIG. 2 is a cross section, enlarged side view of a field separable, low profile electronic package in accordance with a second embodiment of the present invention.

Referring now to FIG. 2, there is shown an electronic package 70 in accordance with an alternate embodiment of the invention for electrically interconnecting electrical circuit members 24 and 34, and intermediate circuit members 94. Although a stack of four parallel circuit members 24, 34, 94 are shown for purposes of disclosure, it should be readily apparent that the concepts taught in this embodiment apply to other quantities of circuit members 24, 34, 94 as well. For this embodiment the clamping mechanism 72 is field separable. This is appropriate for applications that require the ability to upgrade or replace a circuit member 24, intermediate circuit members 94 or connectors 11 in the field.

Intermediate circuit members 94 may comprise materials, structures, components and wirability similar to circuit members 24 and 34, all of which are application dependent. These intermediate circuit members 94 may be printed circuit boards having flat conductive pads (e.g., copper terminals) 28 located on both upper and lower surfaces thereof. Intermediate circuit members 94 may also comprise a circuit module similar to circuit member 24, including a substrate 96 having a plurality of semiconductor elements 32 and/or other components (not shown) thereon. Corresponding thin, flat, copper conductive pads 28 can be located on both upper and lower external surfaces thereof.

Understandably, the conductive pads 28 are electrically coupled to corresponding circuitry, which forms part of the respective electrical circuit members. These pads 28 may provide signal, power or ground connections, depending on the operational requirements of the respective circuit member.

Although a specific means for aligning intermediate circuit members 94 and carriers 12 to circuit module 34 have not been shown specifically in this embodiment, it should be readily apparent to those skilled in the art that many methods may be implemented, including the method described in FIG. 1b.

Clamping means 72 consists of upper plate 74, spacers 76, and retentive members 78. Upper plate 74 again is intended to contact and apply force to the top surface of circuit member 24. Depending on requirements, it may contact only a small portion of the perimeter of circuit member 24 or it may contact a much larger portion thereof. In this embodiment, upper plate 74 is preferably made of a material such as steel, a copper alloy, or a plastic material and is 0.100 inch thick. Steel is preferred for its strength.

Spacers 76 are preferably metal but may also be made of other materials such as plastic. They must be elastically robust in order to maintain the required contact force on all of the contact members 16 over the life of the clamping mechanism 72 following assembly.

Each retentive member 78 consists of a case 88 and inner spring members 90, which further include stops 92. Case 88, spring members 90, and stops 92 may be manufactured as a unitary piece through a process such as extrusion from a material such as metal or plastic. As an alternate, spring members 90 and stops 92 may be formed as a C-shaped spring from a material such as spring steel and then incorporated within a mold or extrusion where the case 88 may be formed from an optimal material.

Case 88 provides several functions beyond being a housing for retentive member 78. It provides a relatively flat surface 82 that is used to attach it to circuit member 34. It also provides rough alignment for the insertion of spacer 76 into retention member 78 and it limits the outward excursion of spring members 90.

Once spacers 76 are inserted into retentive members 78, they work together as integral units to provide the clamping forces on upper plate 74. In this embodiment, the spacer/retentive member pairs 80 are longer strips located just left and right, and extending to the back edge of circuit member 24 and carrier member 12.

The vertical position of the interface between spacers 76 and stops 92 relative to the height of contact members 16 controls the displacement of, or force on the contact members 16 of connector 11. Spring members 90 and stops 92 are designed to allow movement to relieve thermal expansion displacement mismatches during operation. The attachment means 84 can be made as thin as possible in order to be elastically strong but avoid high thermal stresses, which are damaging to thin layers of material.

It should be obvious to those skilled in the art of the myriad possible design and manufacturing alternatives available, such as but not limited to the specific shape, dimensions, processes and materials of the elements of electronic package 70, which may vary depending on specific requirements. These types of variations are well with the scope of the present invention.

In this embodiment spacers 76 are attached to upper plate 74 and retentive members 78 are attached to circuit member 34 by attachment means 84, which is intended to be reworkable at the factory. Many methods may be used to accomplish this reworking procedure including chemical (e.g., dissolvable adhesives) and metallurgical (e.g., thin solder layers).

To take full advantage of the benefits, such as avoiding CTE mismatches and having a light weight and a small form, as this clamping mechanism 72 provides, it is preferable that connector 11 have high compliance to accommodate the non-planarity of mating circuit members 24 and 34, especially at lower clamping forces.

To enable interconnection, circuit member 24 (with spacers 76 attached) is intended to be inserted vertically into retentive member 78 and retained by stops 92 of spring members 90. Removal of circuit member 24 with spacers 76 attached may be accomplished in several ways. The simplest method is to slide circuit member 24 sideways the full length of retentive member 78. Other methods are described in U.S. patent application, Ser. No. 09/774,857.

Figure 3A:
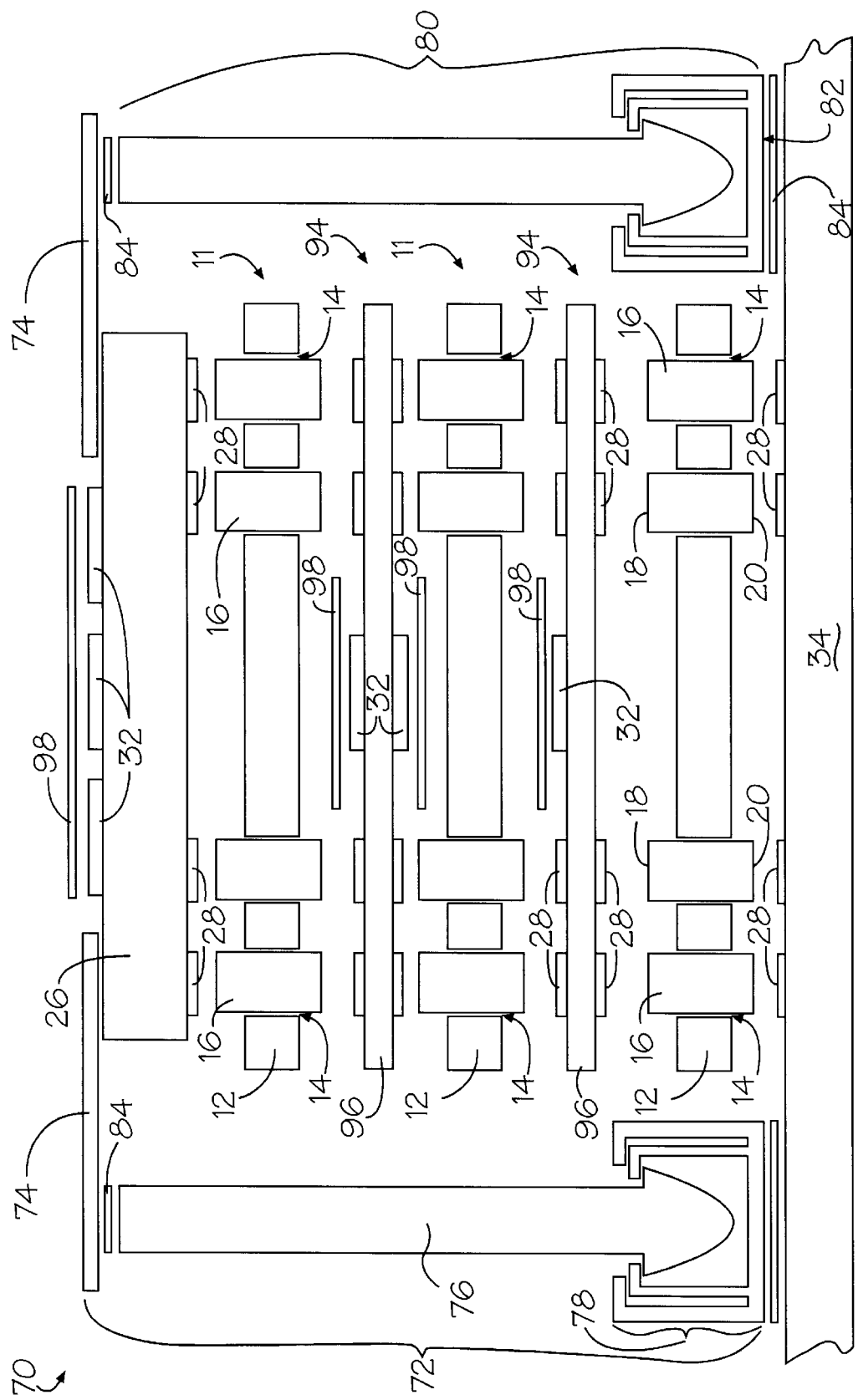
FIG. 3a is a cross section, enlarged side view of a field separable, low profile electronic package in accordance with an extension of the second embodiment of the present invention.
Figure 3B:
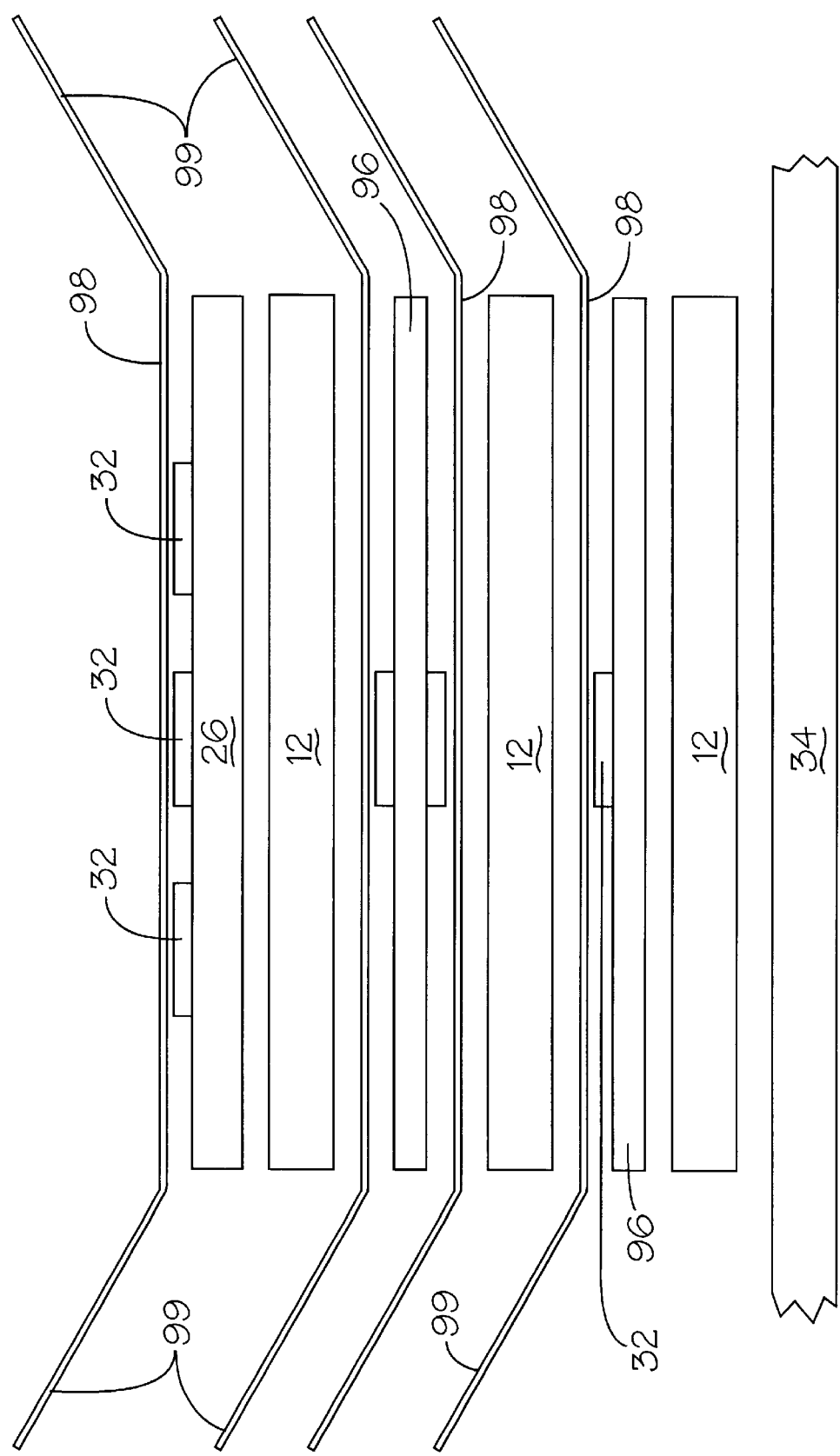

Referring now to FIGS. 3a and 3b, there are shown a cross section, enlarged side view and a cross section, enlarged end view, respectively, of a field separable, low profile electronic package in accordance with an extension of the second embodiment of the present invention, further including thermal management structures 98.

The natural cooling efficiency of an electronic package 70 is low due to the lack of an effective thermal transfer medium from the die or package of semiconductor elements 32 to the air, and the lack of a short air channel in the direction of air flow (i.e., parallel to circuit member 34). It is exacerbated by the relatively large size of today's semiconductor elements 32 and the proximity to other heat generating elements 32 in such a dense package 70. The thermal management structures 98 of the inventive package are designed to optimize both thermal conduction and radiation, thus allowing maximum circuit density without heat build-up, which could degrade semiconductor element 32 performance and reliability.

Thermal management structures 98 are intended to sink heat away from semiconductor elements 32. Such structures 98 may be stand alone elements (e.g., heatsinks) or they may provide a low resistance thermal path to another surface such as the outer enclosure of a device (e.g., a laptop computer), which may include thermally conductive material.

Thermal management structures 98 may be implemented in many ways. They may be as simple as a layer of thermally conductive material, such as aluminum, attached or retained to semiconductor elements 32 by thermally enhanced compounds or clamps. Structures 98 may be more complex (FIG. 3b) and include elements such as fins 99 to augment cooling. Other methods may include the use of conformal pouches of liquid thermal transfer material, thin heat pipes, and thermoelectric devices. Other methods of solving thermal issues will be obvious to those skilled in the art.

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. An electronic package for high frequency semiconductors, comprising:

a) a first circuit member having a top surface and a bottom surface and having at least one conductive pad disposed on one of said surfaces adapted for abutting electrical connection with a first end surface of an electrically conductive, resilient contact member;

b) at least one component located on at least one of said surfaces of said first circuit member and electrically connected to said at least one conductive pad;

c) a second circuit member having a top surface and a bottom surface and having at least one conductive pad disposed on one of said second circuit member surfaces adapted for abutting electrical connection with a second, opposing end surface of said electrically conductive contact member;

d) connector means disposed intermediate said first and second circuit members and a carrier member having a plurality of openings therein adapted to receive at least one electrically conductive contact member having a first and a second end adapted to provide abutting electrical connection between said at least one conductive pad of said first circuit member and said at least one conductive pad of said second circuit member; and e) a clamp comprising a top plate, a spacer, and a relief chamber, at least one of said top plate and said relief chamber being removably affixed to a respective one of said top surface of said first circuit member and said top surface of said second circuit member, respectively, said relief chamber being shaped and adapted to receive a conforming lower end of said spacer and to allow relative movement in two dimensions thereof to compress said at least one contact member of said connector means therebetween, thereby facilitating said abutting electrical connection between said ends of said contact member and said conductive pads on said first and second circuit members.

2. The electronic package for high frequency semiconductors as recited in claim 1, further comprising alignment means operatively connected to at least one of said first or second circuit members for aligning said connector means thereto.

3. The electronic package for high frequency semiconductors as recited in claim 1, further comprising an interposer comprising a plurality of contact pads and a dielectric layer.

4. The electronic package for high frequency semiconductors as recited in claim 1, wherein said first circuit member is a circuit module.

5. The electronic package for high frequency semiconductors as recited in claim 1, wherein said second circuit member is a printed circuit board.

6. The electronic package for high frequency semiconductors as recited in claim 1, wherein at least one of said components is a semiconductor.

7. The electronic package for high frequency semiconductors as recited in claim 6, wherein said semiconductor comprises at least one from the group of:
bare chip, thin, small-outline packages (TSOP), chip scale packages (CSP) and chip on board (COB).

8. The electronic package for high frequency semiconductors as recited in claim 1, wherein at least one of said components is selected from the group:
resistors, capacitors and inductors.

9. The electronic package for high frequency semiconductors as recited in claim 1, wherein said connector means comprises a land grid array connector.

10. The electronic package for high frequency semiconductors as recited in claim 9, wherein said land grid array connector comprises a carrier/housing.

11. The electronic package for high frequency semiconductors as recited in claim 10, wherein said carrier/housing comprises an insulative material.

12. The electronic package for high frequency semiconductors as recited in claim 11, wherein said insulative material has a coefficient of thermal expansion (CTE) that substantially matches the CTE of said first and second circuit members.

13. The electronic package for high frequency semiconductors as recited in claim 1, wherein said removably affixing of said at least one of said top plate and said relief chamber to a respective one of said top surface of said first circuit member and said top surface of said second circuit member, respectively is accomplished using at least one of the processes:
using dissolvable adhesive, and using a metallurgical technique such as thin solder layers, whereby said top plate and said relief chamber may readily be removed from a respective surface for rework.

14. The electronic package for high frequency semiconductors as recited in claim 1, wherein said clamp is field separable.

15. The electronic package for high frequency semiconductors as recited in claim 1, wherein said clamp is CTE mismatch tolerant.

16. The electronic package for high frequency semiconductors as recited in claim 1, wherein said first and second circuit members are substantially parallel to one another.

17. The electronic package for high frequency semiconductors as recited in claim 1, further comprising thermal management structures.

18. The electronic package for high frequency semiconductors as recited in claim 17, wherein said thermal management structures comprise heat-conductive fins in thermal contact with said at least one component.

19. The electronic package for high frequency semiconductors as recited in claim 17, wherein said thermal management structures comprise conformal pouches of liquid thermal transfer material.

20. The electronic package for high frequency semiconductors as recited in claim 17, wherein said thermal management structures comprise thin heat pipes.

21. The electronic package for high frequency semiconductors as recited in claim 17, wherein said thermal management structures comprise thermoelectric devices.

22. An electronic package for high frequency semiconductors, comprising:

a) a first circuit member having at least one conductive pad disposed thereon, and at least one component electrically connected to said at least one conductive pad;

b) a second circuit member having at least one conductive pad disposed thereon;

c) connector means disposed intermediate said first and second circuit members and including a resilient, electrically conductive contact member to provide abutting electrical interconnection between said at least one conductive pad of said first circuit member and said at least one conductive pad on said second circuit member; and d) a clamp comprising a top plate, a spacer, and a relief chamber, at least one of said top plate and said relief chamber being removably affixed to a respective one of said top surface of said first circuit member and said top surface of said second circuit member, respectively, said relief chamber being shaped and adapted to receive a conforming lower end of said spacer and to allow relative movement in two dimensions thereof to compress said resilient contact member of said connector means between said first and said second circuit members, thereby facilitating said abutting electrical connection between said resilient contact member and said at least one conductive pad on said first and second circuit members.

23. The electronic package for high frequency semiconductors as recited in claim 22, further comprising alignment means operatively connected to at least one of said first or second circuit members for aligning said connector means thereto.

24. The electronic package for high frequency semiconductors as recited in claim 22, further comprising an interposer comprising a plurality of contact pads and a dielectric layer.

25. The electronic package for high frequency semiconductors as recited in claim 22, wherein said first circuit member is a circuit module.

26. The electronic package for high frequency semiconductors as recited in claim 22, wherein said second circuit member is a printed circuit board.

27. The electronic package for high frequency semiconductors as recited in claim 22, wherein at least one of said components is a semiconductor.

28. The electronic package for high frequency semiconductors as recited in claim 27, wherein said semiconductor comprises at least one from the group of:

bare chip, thin, small-outline packages (TSOP), chip scale packages (CSP) and chip on board (COB).

29. The electronic package for high frequency semiconductors as recited in claim 22, wherein at least one of said components is selected from the group:

resistors, capacitors and inductors.

30. The electronic package for high frequency semiconductors as recited in claim 22, wherein said connector means is a land grid array connector.

31. The electronic package for high frequency semiconductors as recited in claim 30, wherein said land grid array connector comprises a carrier/housing.

32. The electronic package for high frequency semiconductors as recited in claim 31, wherein said carrier/housing comprises an insulative material.

33. The electronic package for high frequency semiconductors as recited in claim 32, wherein said insulative material has a coefficient of thermal expansion (CTE) that substantially matches the CTE of said first and second circuit members.

34. The electronic package for high frequency semiconductors as recited in claim 22, wherein said clamp is reworkable.

35. The electronic package for high frequency semiconductors as recited in claim 22, wherein said clamp is field separable.

36. The electronic package for high frequency semiconductors as recited in claim 22, wherein said clamp is CTE mismatch tolerant.

37. The electronic package for high frequency semiconductors as recited in claim 22, wherein said first and second circuit members are substantially parallel to one another.

38. The electronic package for high frequency semiconductors as recited in claim 22, further comprising thermal management structures.

39. The electronic package for high frequency semiconductors as recited in claim 38, wherein said thermal management structures comprise heat-conductive fins in thermal contact with said at least one component.

40. The electronic package for high frequency semiconductors as recited in claim 38, wherein said thermal management structures comprise conformal pouches of liquid thermal transfer material.

41. The electronic package for high frequency semiconductors as recited in claim 38, wherein said thermal management structures comprise thin heat pipes.

42. The electronic package for high frequency semiconductors as recited in claim 38, wherein said thermal management structures comprise thermoelectric devices.

* * * * *